US 8,338,283 B1

(12) United States Patent
Erlach

(10) Patent No.: US 8,338,283 B1
(45) Date of Patent: Dec. 25, 2012

(54) METHOD AND APPARATUS FOR APPLYING THIN LIQUID COATINGS

(75) Inventor: David M. Erlach, Santa Barbara, CA (US)

(73) Assignee: Innovative Micro Technology, Goleta, CA (US)

(*) Notice: Subject to any disclaimer, the term of this patent is extended or adjusted under 35 U.S.C. 154(b) by 0 days.

(21) Appl. No.: 13/373,969

(22) Filed: Dec. 7, 2011

(51) Int. Cl.
*H01L 21/20* (2006.01)
*H01L 21/31* (2006.01)
*H01L 21/469* (2006.01)

(52) U.S. Cl. .. 438/584; 438/758; 438/778; 257/E23.116

(58) Field of Classification Search .......................... None
See application file for complete search history.

(56) References Cited

U.S. PATENT DOCUMENTS

| 6,027,630 | A | * | 2/2000 | Cohen | 205/135 |
| 2004/0013982 | A1 | * | 1/2004 | Jacobson et al. | 430/320 |
| 2007/0175347 | A1 | * | 8/2007 | Seo et al. | 101/350.6 |
| 2009/0194509 | A1 | * | 8/2009 | Nada et al. | 216/83 |

* cited by examiner

*Primary Examiner* — Seahvosh Nikmanesh
*Assistant Examiner* — Evren Seven
(74) *Attorney, Agent, or Firm* — Jaquelin K. Spong

(57) ABSTRACT

Systems and methods for applying a thin layer of a liquid to the surface of a wafer with topography formed therein. The systems and methods include spreading a deposit of the liquid into a thin film on a wafer support, lowering the wafer onto the film, removing the wafer with an adhering layer of the film, positioning the wafer over a device wafer with the liquid film disposed between the wafers, curing the thin layer. The thin layer may be a UV adhesive which bonds the wafers upon exposure to UV light.

10 Claims, 21 Drawing Sheets

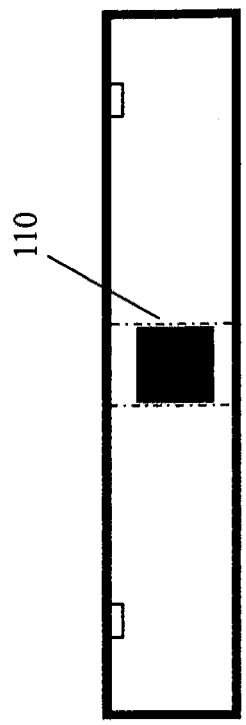
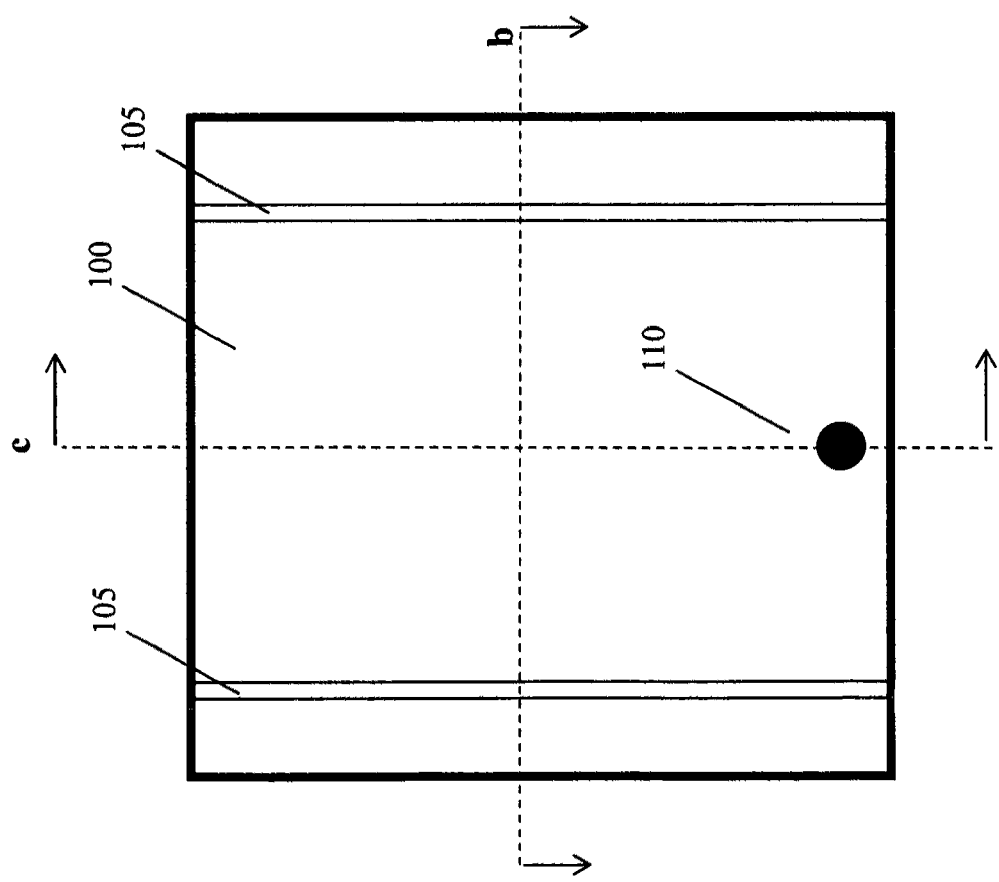
Figure 1b
Figure 1a

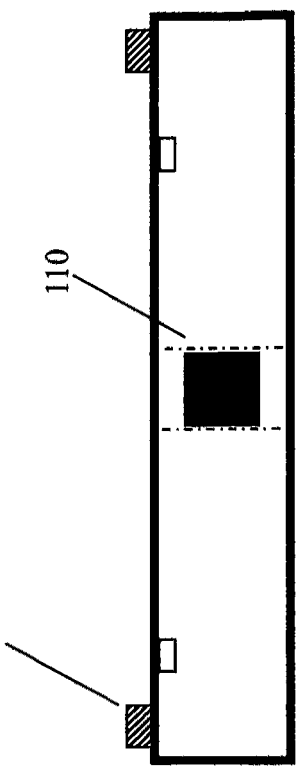
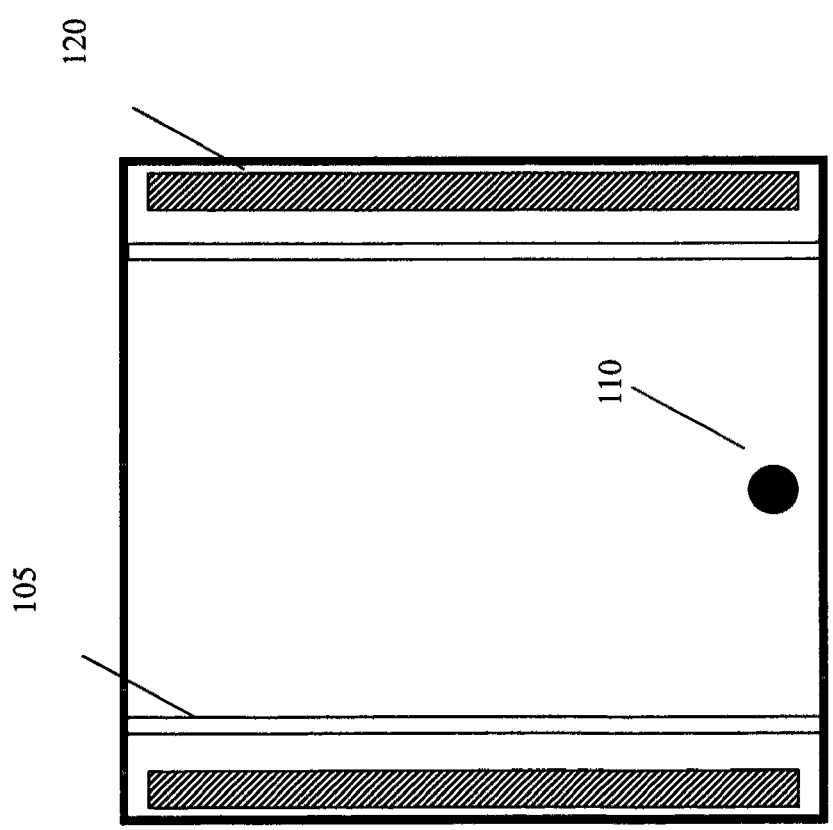
Figure 2b
Figure 2a

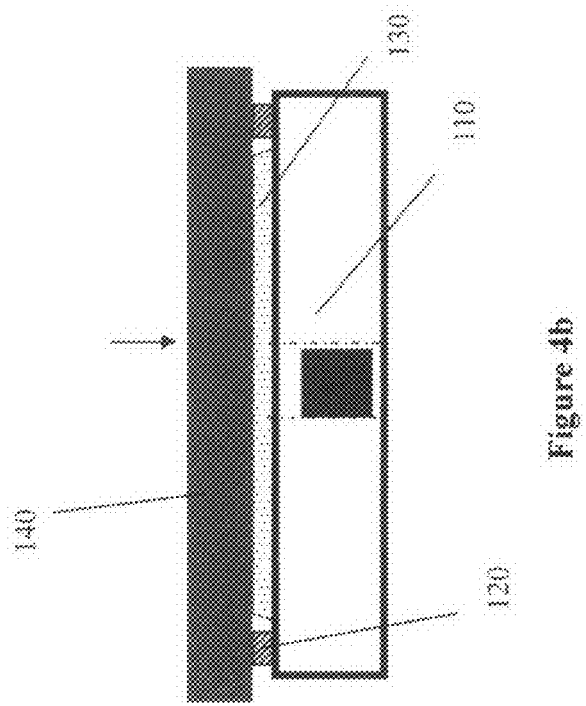
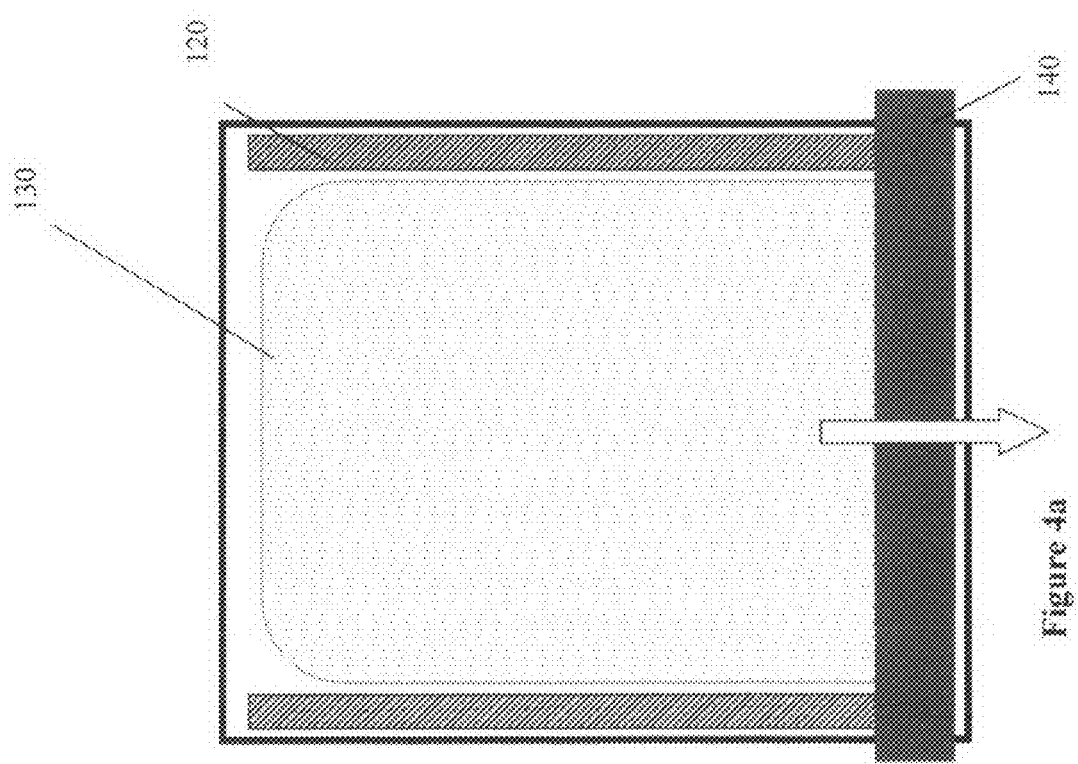
Figure 4b
Figure 4a

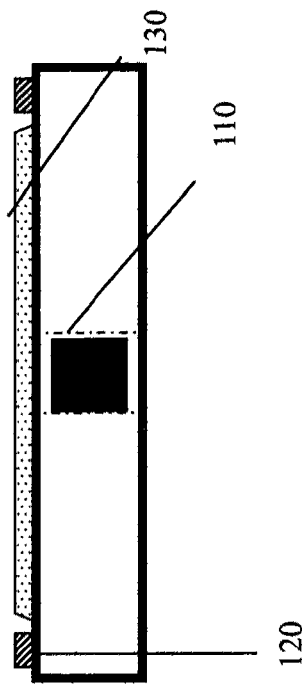
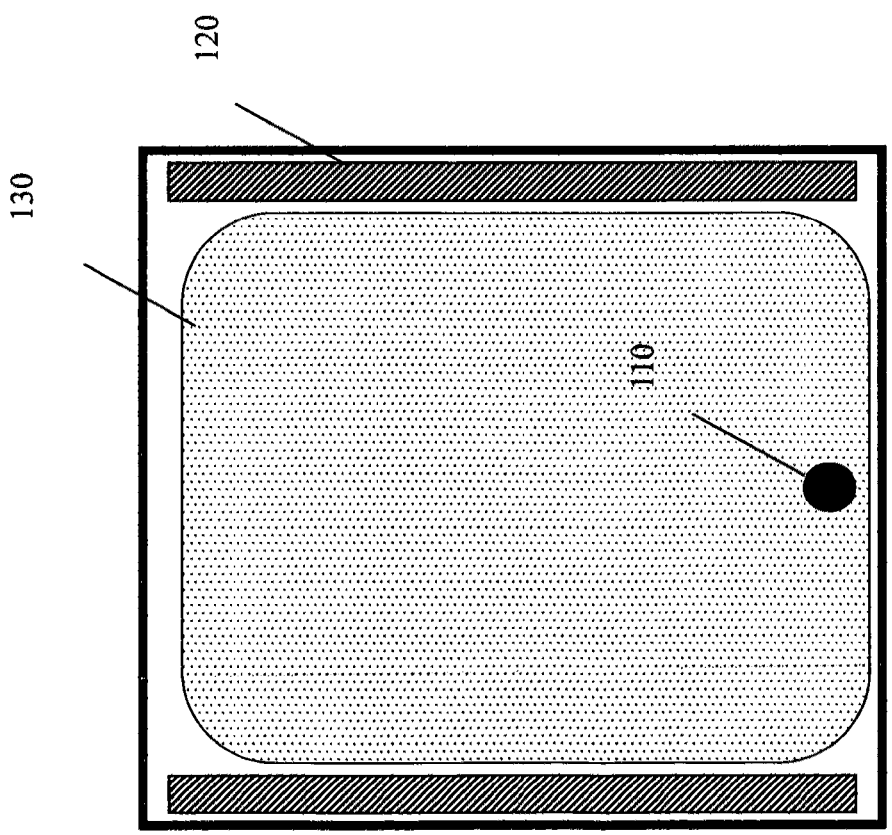
Figure 5b
Figure 5a

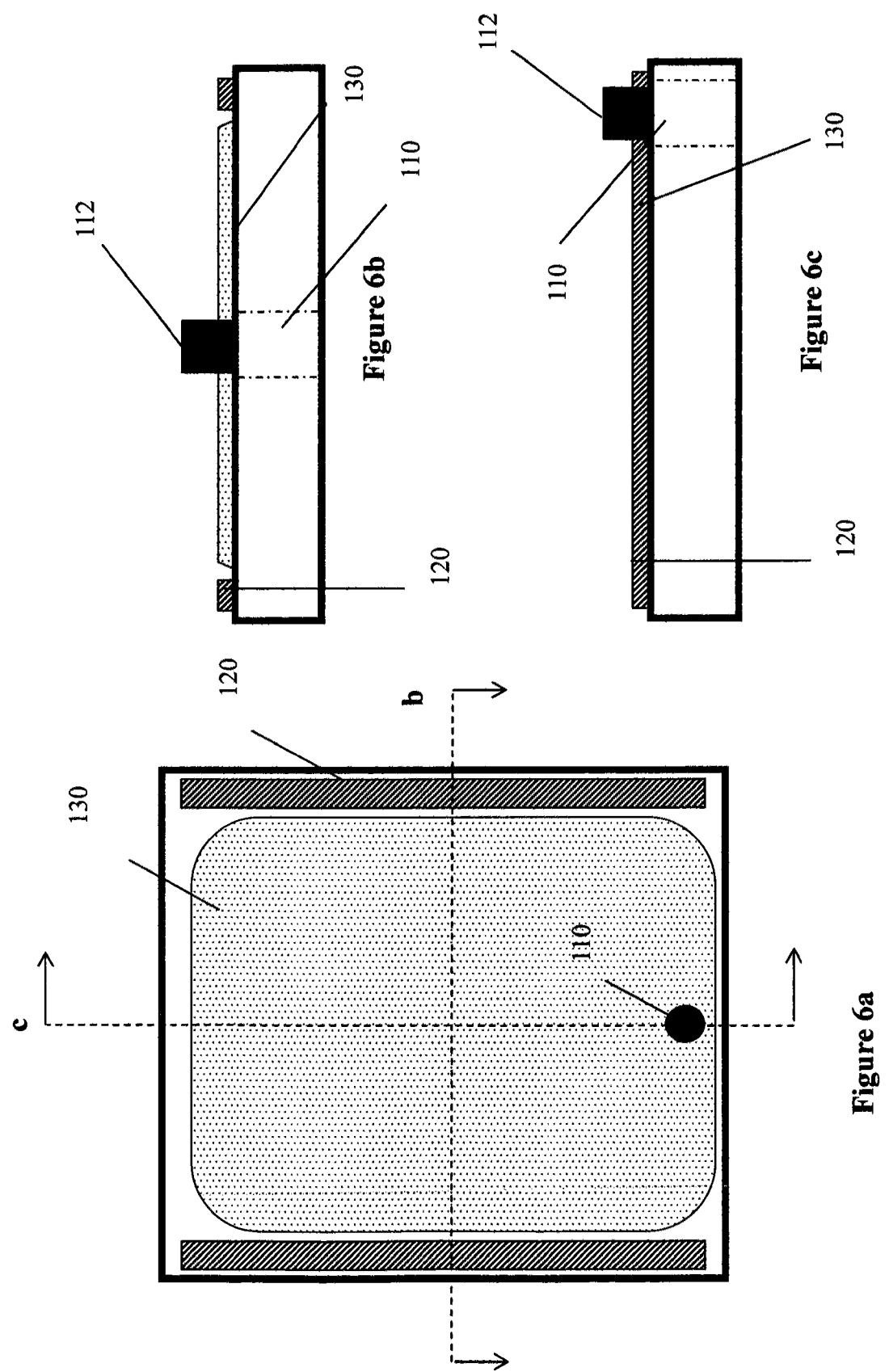

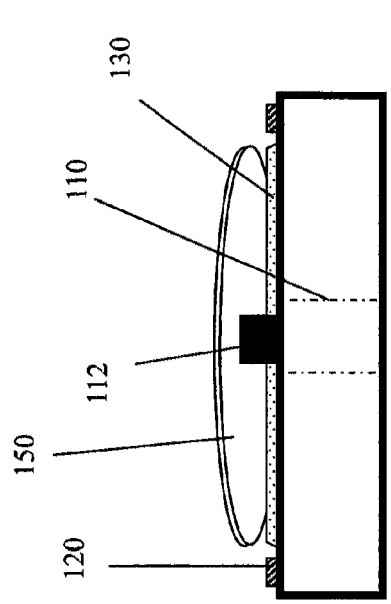
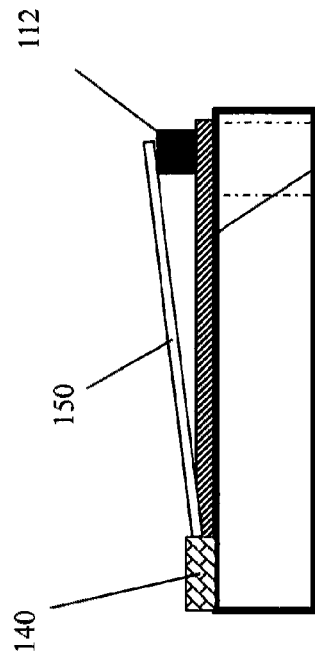
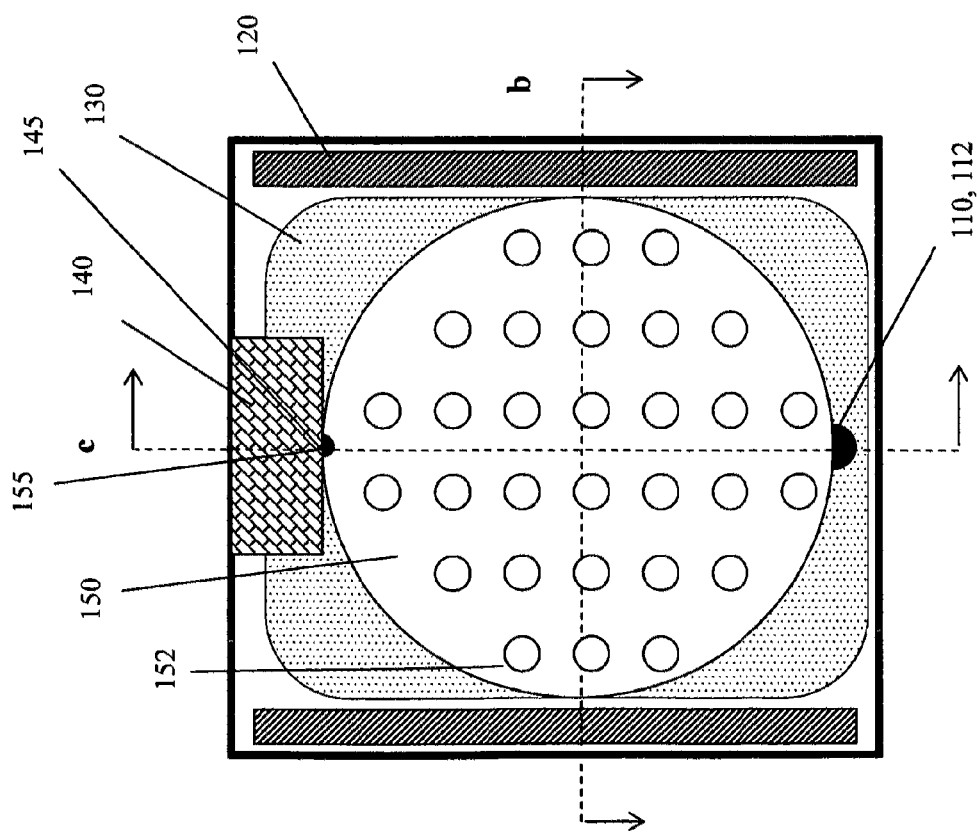

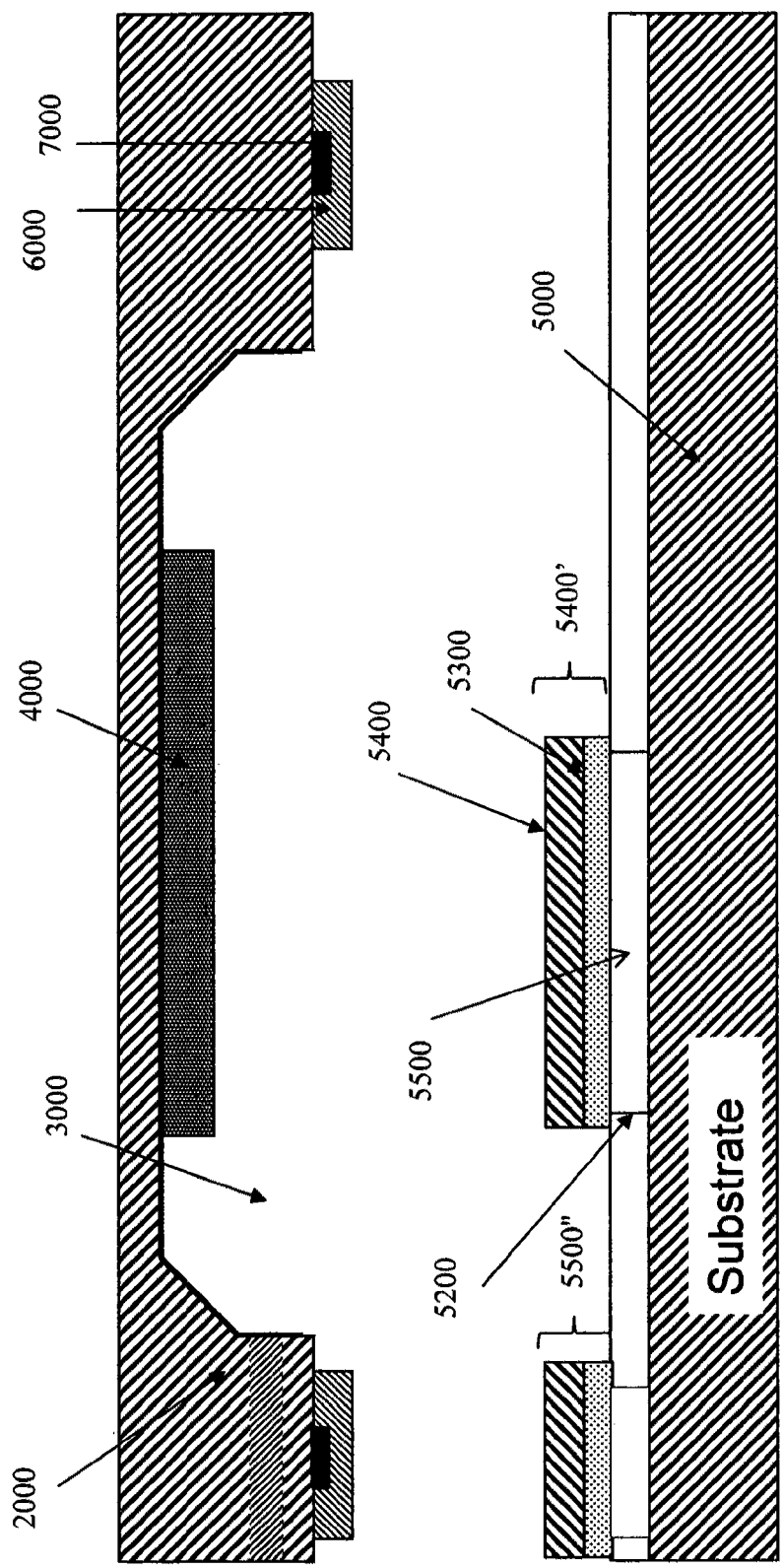
Fig. 9 wafer with permeable material under bondline and getter

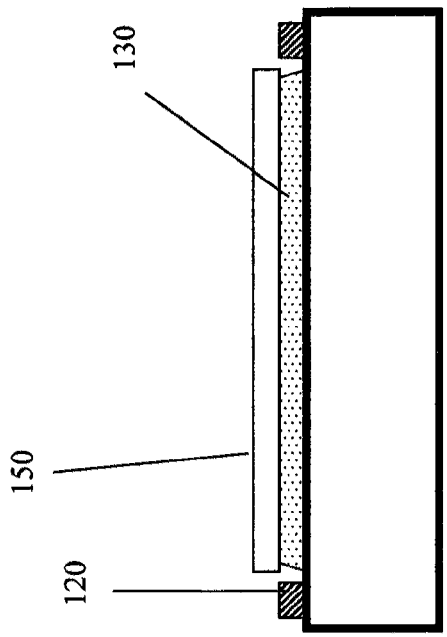
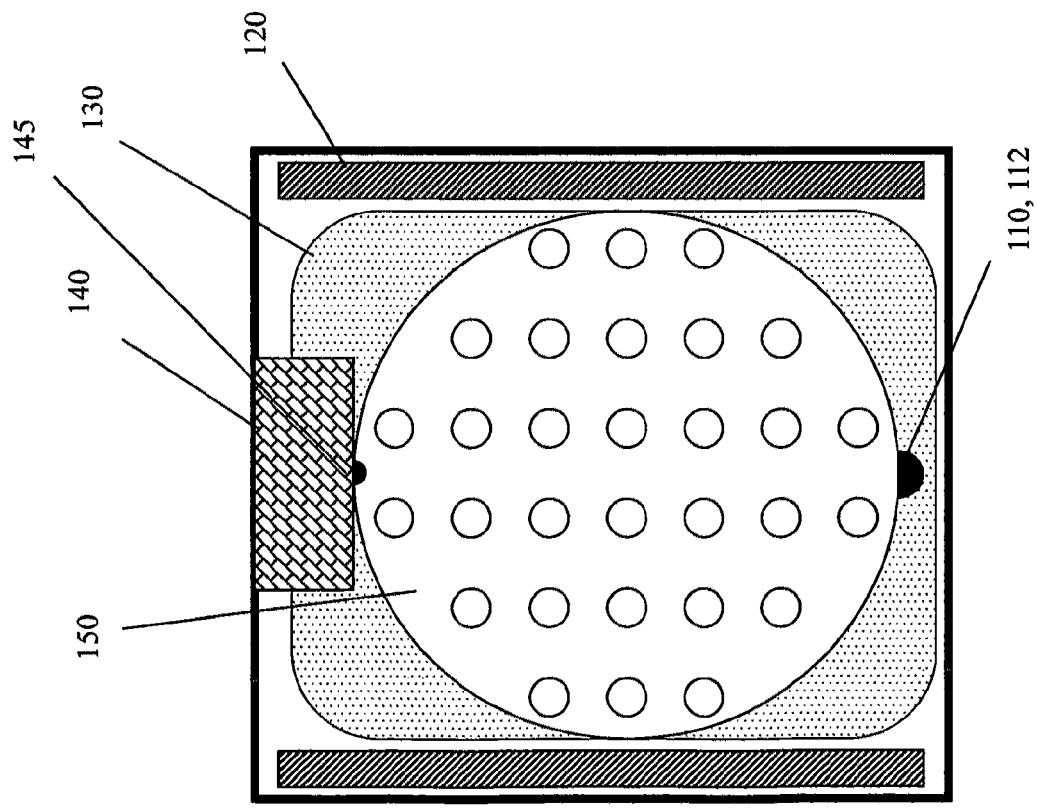

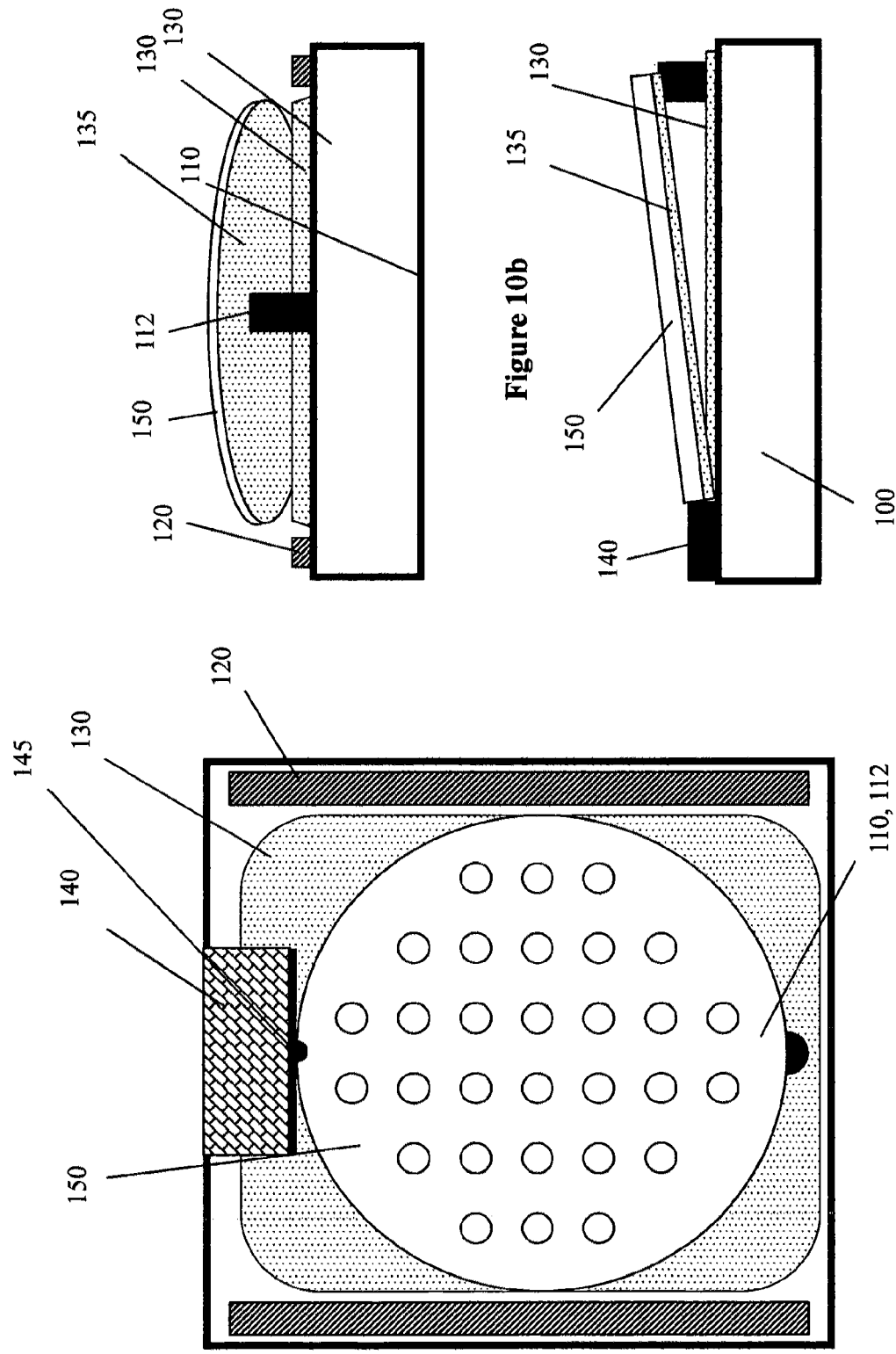

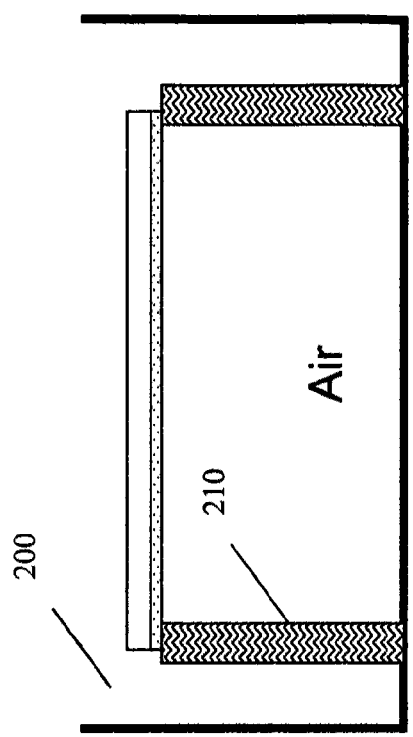
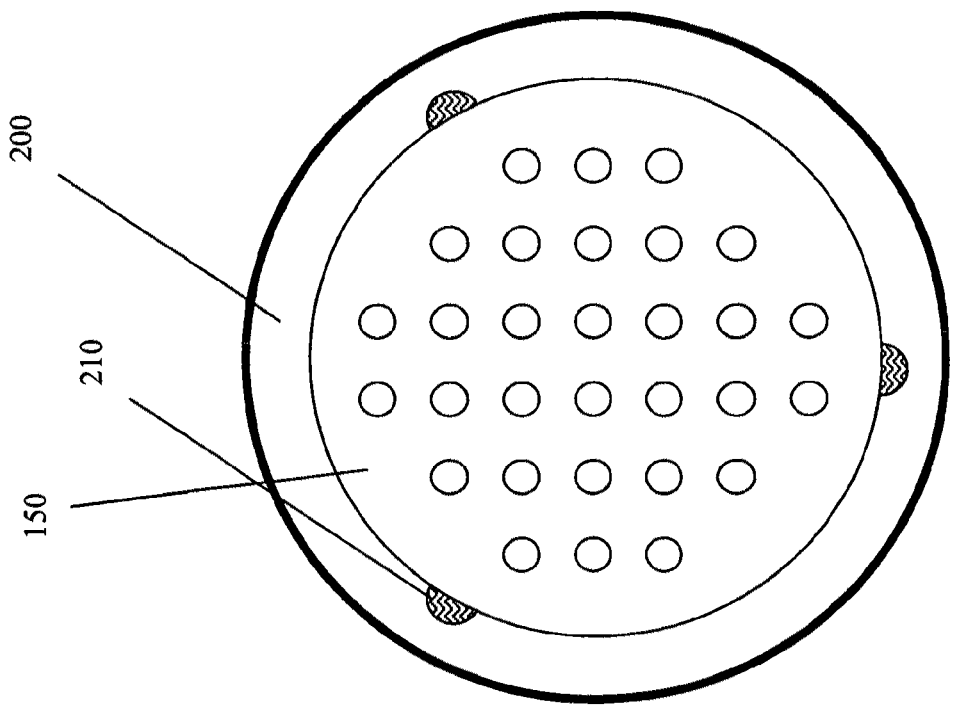
Figure 11b
Figure 11a

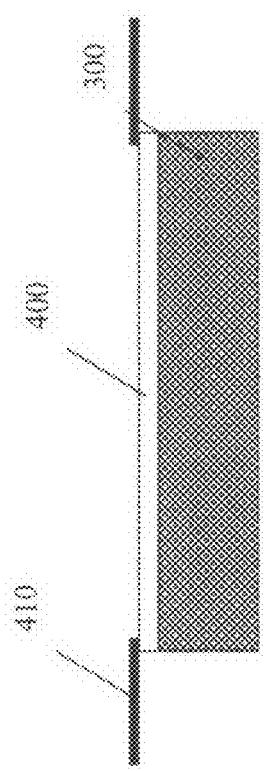
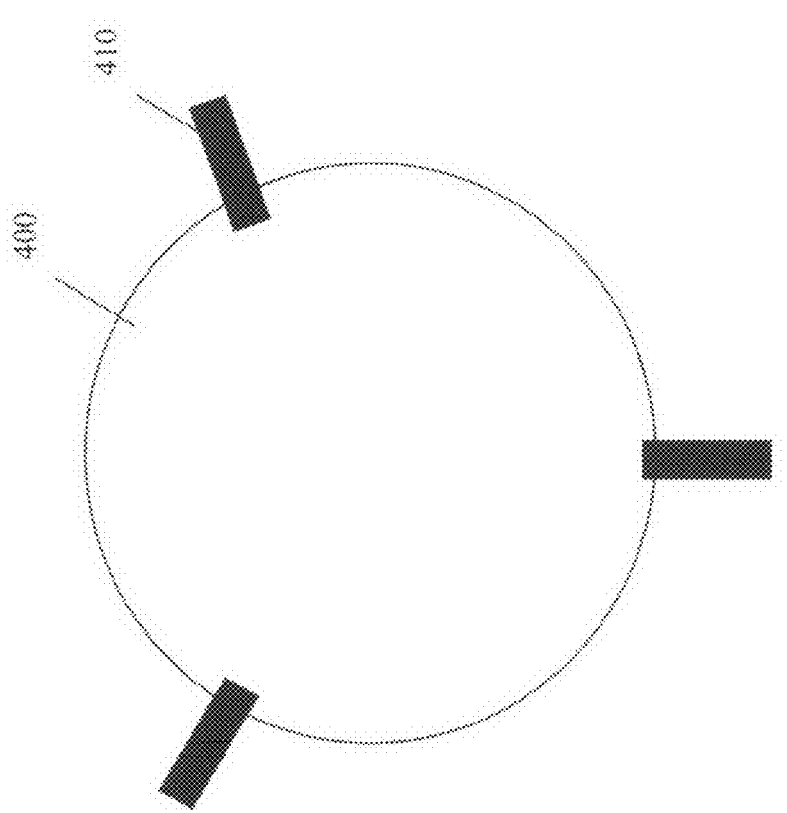
Figure 15b
Figure 15a

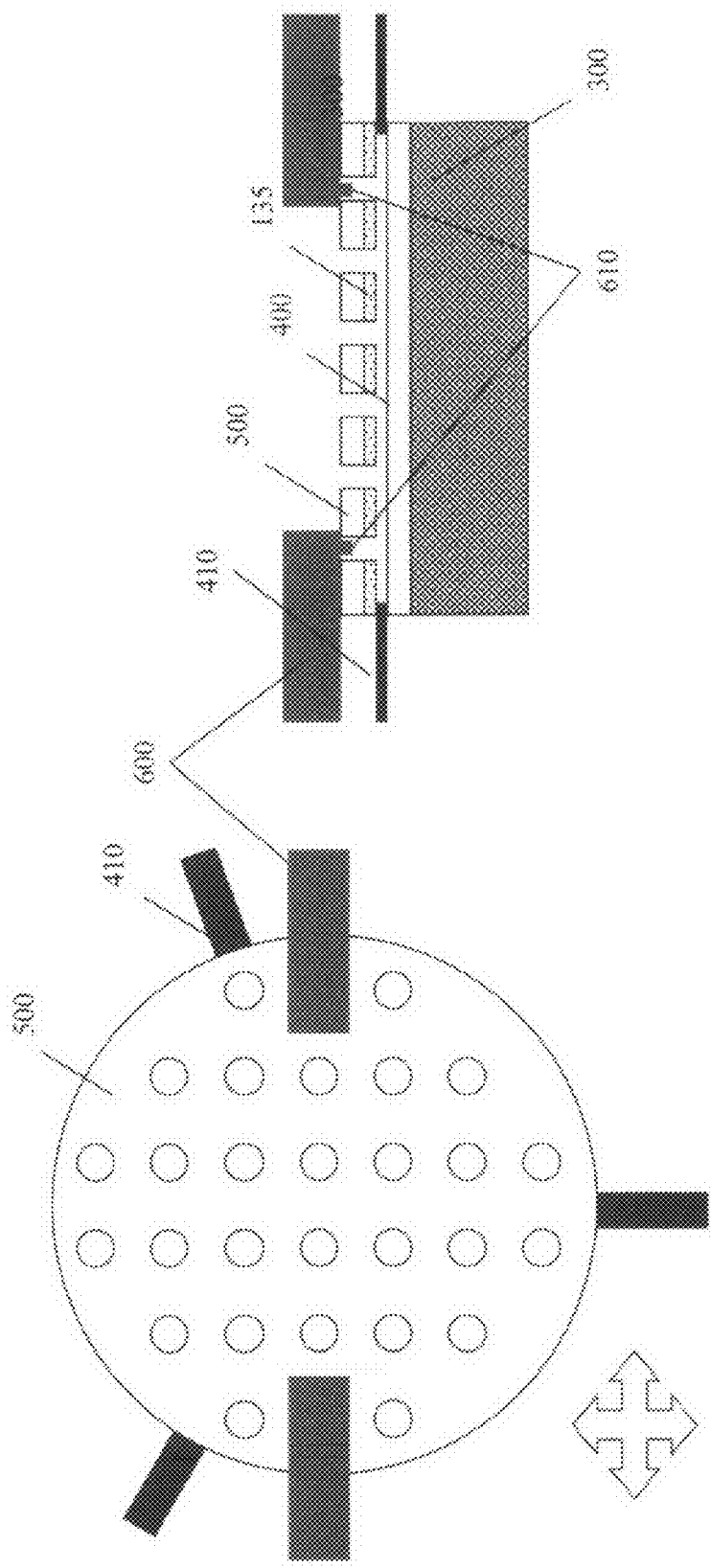

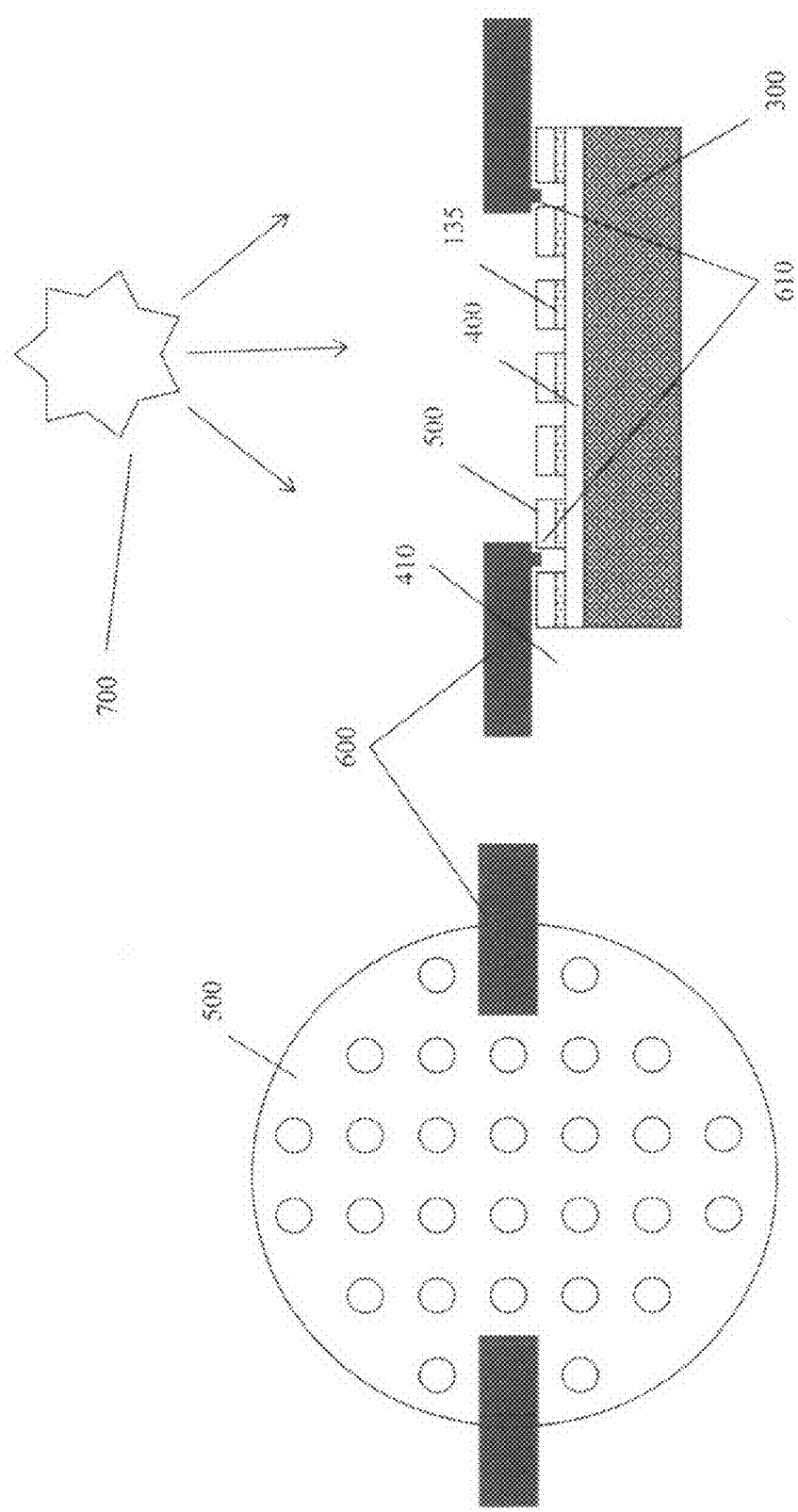

METHOD AND APPARATUS FOR APPLYING THIN LIQUID COATINGS

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to the application of a thin layer of a liquid film to the surface of a substrate or wafer. More specifically, this invention relates to the deposition of a thin liquid film of the surface of a wafer with topography previously formed on the surface of the wafer.

Thin films of material are often applied to the surfaces of semiconductor wafers for various purposes. Photoresist may be spun on, using centripetal force to move the liquid resist across the wafer to form a thin film. Adhesives may also be applied, which may allow the bonding of the wafer to another wafer or a lid wafer, to encapsulate devices on either one of the wafers.

Transparent adhesives, such as SU-8 negative photoresist may be used as both an adhesive as well as a lithographic photoresist, for applications where light transmission through one or both wafers is required for proper functioning.

In each of these cases, it is important for the thickness of the liquid layer to be uniform. The thickness of the photoresist, for example, will affect the dimensional tolerances of the structures formed by the resist. The thickness of the adhesive layer may affect its light transmission properties, or the total thickness of the wafer stack, or the bonding strength between the wafers of the stack.

It is particularly problematic to form the uniform thin liquid film over wafers whose surface has topography formed therein. The movement of the liquid during application may be impeded by high lying areas, and collect in the low-lying areas such as trenches, vias, wells or depressions. The liquid collecting in these areas may interfere with the proper functioning of the device.

SUMMARY

An apparatus and method is described herein for forming a liquid layer on a substrate with a uniform thickness. The system and method may be applied to any number of liquid materials, including resists, oils and lubricants, and adhesives.

The system and method are particularly helpful when applied to wafers which have some structure or topography already formed therein. For example, in the application described below, the wafer may have an array of through holes (vias) or blind holes (wells) formed therein. This wafer is referred to throughout as the "well wafer" which will be adhered to a "device wafer," which supports a plurality of microfabricated devices, using the method described herein. Using this method, a liquid film can be achieved on the well wafer despite this topography, wherein the layer is uniform over the surface despite the holes.

The systems and methods described here use a spacer, wafer support (wafer chuck) and a hard bar having a smooth outer surface. The spacers may be of well-defined thickness t and are used to establish a height of the liquid material across the surface of the wafer. In one embodiment, the liquid is a UV adhesive. The spacers are disposed on the wafer support and separated laterally by a distance which is at least the diameter of the wafer to be coated. The droplet of the liquid is then applied between the spacers. The liquid is spread from the droplet by the hard, uniform bar which is rolled across the droplet while being supported by the spacers. This forms a layer of liquid whose thickness t is defined by the spacer thickness t. A moat feature may be used between each spacer and the applied film of liquid to prevent the spacers becoming wetted with liquid.

The wafer to be coated is then laid on the liquid film between the spacers. When the wafer is removed, it retains a thin coating of the liquid on its surface which is about one-half the thickness (t/2) of the liquid film, and the other one-half of the film remains on the support or chuck.

The well wafer is then held above the device wafer and aligned to the device wafer. The wafers are brought together and illuminated with UV light in order to cure the UV adhesive. In other embodiments, the wafer stack may be heated to cure and adhesive, or left to air dry.

These and other features and advantages are described in, or are apparent from, the following detailed description.

BRIEF DESCRIPTION OF THE DRAWINGS

Various exemplary details are described with reference to the following figures. It should be understood that the features depicted in these figures are not necessarily rendered to scale, and the same reference numbers may refer to like features in each of the views. In following figures:

FIG. 1a shows a top view and FIG. 1b shows a cross sectional view of a first step in the process, and illustrates the axes along which cross sections will be taken in the following figures;

FIG. 2a shows a top view and FIG. 2b shows a cross sectional view of a second step in the process;

FIG. 4a shows a top view and FIG. 4b shows a cross sectional view of a fourth step in the process;

FIG. 5a shows a top view and FIG. 5b shows a cross sectional view of a fifth step in the process, and illustrates the dimension t;

FIG. 6a shows a top view and FIG. 6b shows a cross sectional view across a horizontal axis and FIG. 6c shows a cross sectional view across a vertical axis of a sixth step in the process;

FIG. 8a shows a top view and FIG. 8b shows a cross sectional view across a horizontal axis and FIG. 8c shows a cross sectional view across a vertical axis of a eighth step in the process;

FIG. 9a shows a top view and FIG. 9b shows a cross sectional view of a ninth step in the process;

FIG. 10a shows a top view and FIG. 10b shows a cross sectional view across a horizontal axis and FIG. 10c shows a cross sectional view across a vertical axis of a tenth step in the process;

FIG. 11a shows a top view and FIG. 11b shows a cross sectional view of a eleventh step in the process;

FIG. 15a shows a top view and FIG. 15b shows a cross sectional view of a fifteenth step in the process;

FIG. 17a shows a top view and FIG. 17b shows a cross sectional view of a seventeenth step in the process;

FIG. 18a shows a top view and FIG. 18b shows a cross sectional view of a eighteenth step in the process;

DETAILED DESCRIPTION

Figure 3B:
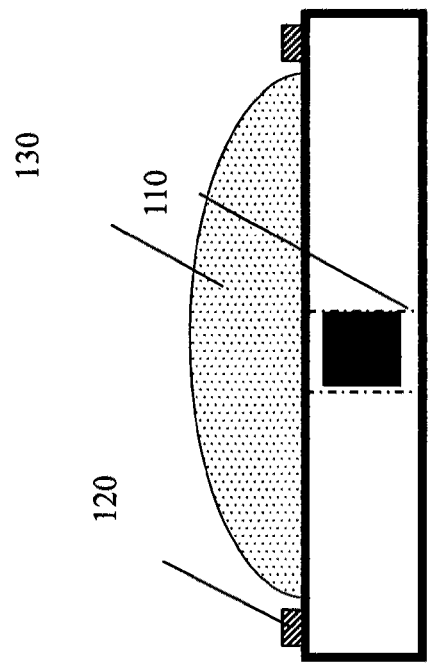
FIG. 3a shows a top view and FIG. 3b shows a cross sectional view of a third step in the process.

In the systems and methods described here, a semiconductor wafer may be fabricated with a plurality of holes or other topography formed therein. Thus, although the majority of the wafer surface is flat, there may be a plurality of depressions formed therein. These depressions may provide optical apertures or mechanical clearance for a device to be placed within the depression. Alternatively, the depressions may for a part of the active device, for example, the depressions may contain a fluid or solution over and active area of a device located at the bottom of this hole or depression.

It is frequently desired to bond this semiconductor wafer having topography to a second or even an third wafer, in order to complete the manufacturing of the product. Indeed, using the techniques described herein, multiple wafers with holes and/or channels may be stacked, without limit, to form fluidic pathways. This second wafer may have the devices formed thereon, for example. In order to bond the wafers, a bonding agent may be applied to one or both wafer surfaces in a periphery around each device. However, applying a thin film of adhesive on a surface with topography is problematic, as the liquid tends to build up in concave areas and retreat from convex areas. Wafers with holes may be particularly challenging, as quantities of liquid tend to collect in these holes. The systems and methods described here may be particularly applicable to this situation, that is, a wafer with a plurality of blind or through holes formed therein, to be bonded to another wafer with a thin layer of adhesive.

Accordingly, the systems and methods described here may be used to apply and cure a thin layer of a liquid film to the surface of a wafer having topography formed therein. The liquid film may be an adhesive, a lubricant or a photoresist, for example. The system and method result in a uniform film across the smooth wafer surface, for example in the lands areas around the depressions, with no excessively thick or thin areas, and no buildup of the liquid in the depressions.

FIG. 1 shows a plan view of the beginning setup. The first component of the system may be a support, or wafer chuck 100. The material of the support may be aluminum or granite, for example, or any other mechanically competent material which can be rendered with a flat, hard surface 100. A through hole 110 may be formed in support 100, which will accommodate an elevator pin 112. The elevator pin 112 will be used later to raise or lower a wafer from the flat surface of support 100. The elevator pin 112 may be formed to slide easily within the through hole 110.

There may also be formed in the support 100 one or more troughs or "moats" 105. These troughs or moats 105 may serve to collect excess fluid so that the spacers (described below) do not become wetted with the fluid. These troughs may be anywhere from a few microns to a fraction of a millimeter in depth, and may extend across most or all of the longitudinal surface of the support 100 as shown in FIG. 1a and FIG. 1b. The troughs may preferable extend across a substantial portion of the support surface 100, for example, the troughs may extend across at least 75% of the surface in the longitudinal direction, wherein the longitudinal direction is defined by the spacers described below. Although these troughs are only depicted in FIGS. 1a, b and 2a, b, they should be understood to be an optional feature in all the following FIGS. 3-20.

In one exemplary embodiment, the support 100 is an 8 inch by 8 inch block of hard anodized aluminum. This surface may be ground after anodizing to provide exceptional smoothness and flatness. The support 100 may be leveled to assure a flat, level surface. The surface of the support 100 may also be cleaned with isopropyl alcohol or other suitable solvent.

The axes b and c in FIG. 1a denote symmetry axes through which cross sections will be taken in later figures. In figures labeled Fig. Xb, the cross section is taken through the vertical b-axis. In figures labeled Fig. Xc, the cross section is taken through the horizontal, c-axis. FIG. 1b shows a cross section taken through the b-axis, for example, and shows the location of the through hole 110.

The next component of the system may be a pair of thin spacers 120 as shown in FIG. 2a. The thickness, t, of these spacers will define a distance between a wafer which will be laid on top of the spacers, and the hard surface of the support 110. The spacers may be, for example, about 25 um thick, and made of a stainless steel foil or shim stock. The spacers 120 may be affixed to the surface of support 100 with tape or glue. Components such as foils or shims are generally made with a well-defined thickness, and thus are suitable for this application. The spacers 120 should preferably be of uniform thickness along their length. Stainless steel may be the material chosen for the spacer, because it is mechanically competent, may have a well-defined thickness, and resists rust and corrosion. However, other materials such as plastic, resins, or vinyl may be used in place of steel. The cross section of the system across the horizontal axis is shown in FIG. 2b. The location of the troughs or moats 105 is shown in FIGS. 2a and 2b, with respect to the location of the spacers 120. The troughs are preferably formed in a direction parallel to the spacers, which define the longitudinal direction of the support 100.

In one exemplary embodiment, the spacers are rectangular pieces of stainless steel foil, at least about 200 mm long and separated by at least about 150 mm to accommodate a 6-inch semiconductor wafer therebetween. In other exemplary embodiments, the may be separated by at least about 200 mm to accommodate an 8-inch wafer.

Figure 3A:
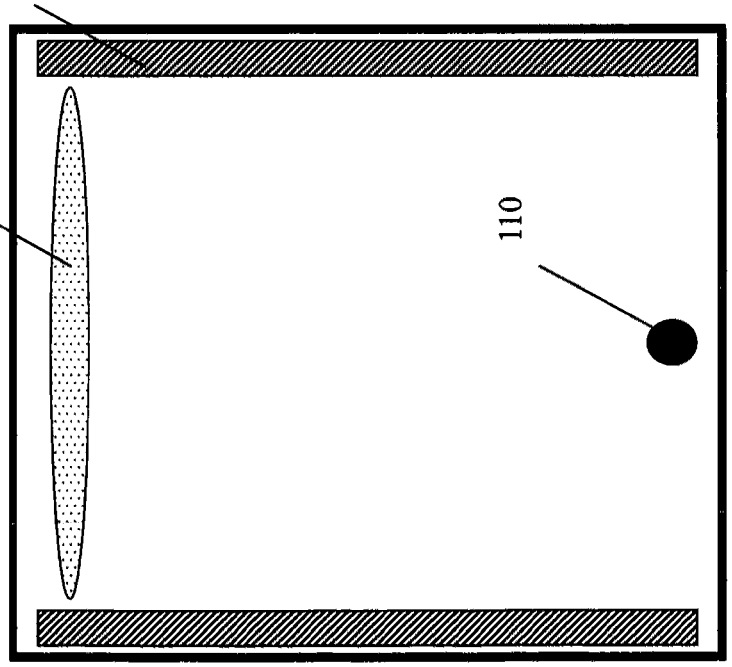

In FIG. 3a, a quantity of the liquid 130 to be spread on the wafer surface is deposited on the support 110, between the spacers 120. As mentioned previously, this liquid may be an adhesive, a lubricant, or a photoresist for example. The cross section across the system along the vertical axis is shown in FIG. 3b. In other embodiments, the liquid 130 may be dispensed in a zig-zag or other pattern to allow coverage of the entire wafer area.

In one exemplary embodiment, the liquid 130 is about 3 mL UV adhesive or epoxy, applied to the anodized aluminum support surface 100. The adhesive may be applied in the shape of a line near either extremity of the aluminum support 100, and between the steel spacers 120.

In FIG. 4a, a rigid rod or dowel 140 is rolled or dragged across the surface of the support 110, supported over the surface by the steel spacers. The rod 140 may preferably be straight and have a fine finish. This spreads the liquid and forms a thin film of the liquid 130 between the spacers. This film 130 of liquid may have a thickness determined by the thickness of the spacers 120. The rod 140 is may then be removed and subsequently cleaned. FIG. 4b shows the cross section of the system along the vertical axis during the film spreading. The term "rod" should be understood to mean a rigid cylindrical member having a length substantially longer that the diameter of the cylinder.

In one exemplary embodiment, the rod 140 is a 0.5-inch-thick, 12-inch-long stainless steel rod, which may be translated over the spacers so that the UV epoxy is spread uniformly on the aluminum block surface. Preferably, the rod is only translated in one direction and in a single motion. If the bar is translated forward and backward, regions of non-uniform film thickness may be formed at the extremities of the bar motion where the motion reverses.

In FIG. 5a, the condition of the support 100 is shown after spreading of the film 130. As shown, the support is now covered by a thin liquid film of thickness t, where t is the thickness of the steel spacers 120. FIG. 5b shows the cross section of the system along the vertical axis after the film spreading.

FIG. 6a shows the next step in the process. In FIG. 6a, the elevator pin 112 is raised within the through hole 110. This elevator pin will support the wafer as described below. FIG. 6b shows the cross section of the system along the symmetry axis b after raising of the elevator pin 112. FIG. 6c shows the cross section of the system along the symmetry axis c in FIG. 6a.

Figure 7B:
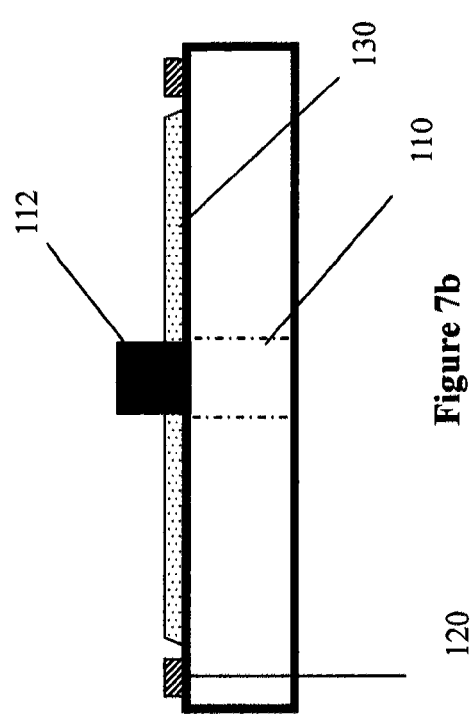
FIG. 7a shows a top view and FIG. 7b shows a cross sectional view across a horizontal axis and FIG. 7c shows a cross sectional view across a vertical axis of a seventh step in the process.
Figure 7C:
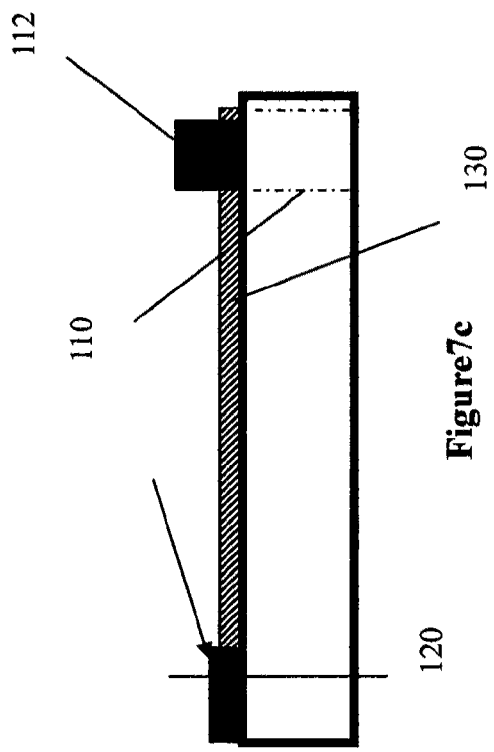
Figure 7A:
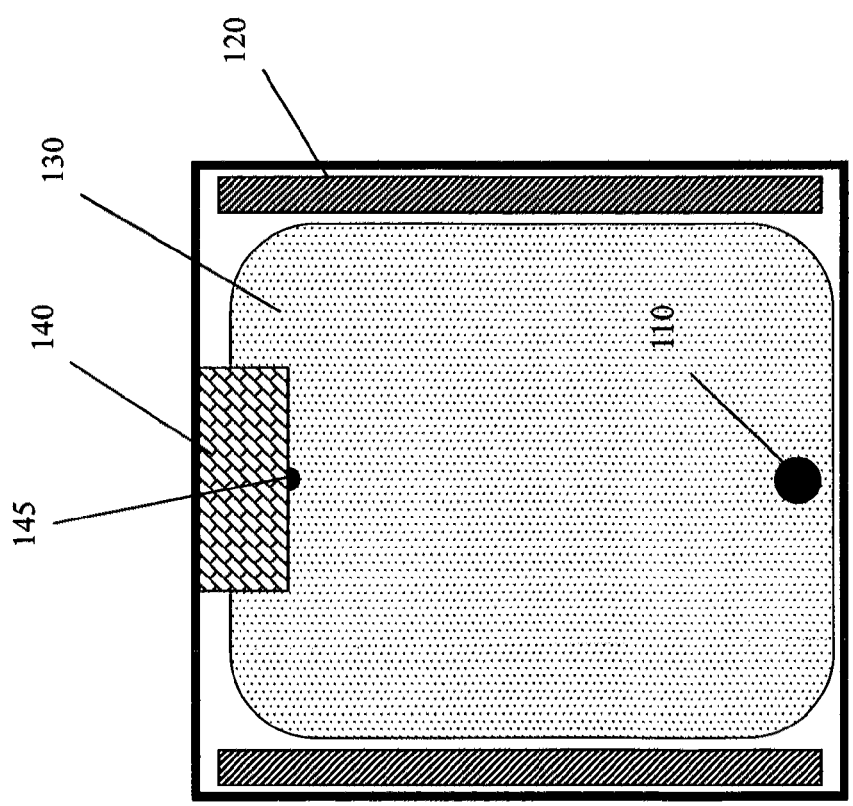

In FIG. 7a, a wafer seat 140 is attached to the support 100. The wafer seat 140 may be any convenient material, and may be removably fastened to the support 100 by, for example, a screw or détente pin. The wafer seat 140 is provided with a notch 145, which will mate with the notch in the well wafer 150. Many wafers are fabricated with such a feature that allows orientation at a specific angle with respect to a fixture. The feature need not be a notch, but may instead be a section which is removed along a chord to destroy the symmetry of the wafer. Any feature which is provided in the wafer to destroy symmetry may be used to locate the wafer against the wafer seat 140. The notch is only an exemplary embodiment.

For ease of illustration, the connection between the wafer seat 140 and the support 100 is not shown, but it should be understood that a screw attachment may suffice. The connection may preferably be made clear of the liquid film. The cross section of the support 100 and the wafer seat 140 is shown in FIG. 7b.

As in previous figures, FIG. 7b shows the cross section of the system after raising of the elevator pin 112 along the line b in FIG. 6a. FIG. 7c shows the cross section of the system along the line c in FIG. 6a.

FIG. 8a, b shows the system after insertion of a well wafer 150. Wafer 150 may have a plurality of blind holes, through holes, wells or depressions 152 formed therein, and is therefore referred to henceforth as well wafer 150. These wells may contain a fluid for the device, or may form a cavity to provide clearance for the device. In any case, the wafer 150 may have at least one topographic feature, such as a bump, structure or depression, on its surface, so that its surface is not flat. It is desired to place a thin layer of a liquid film over this non-continuously flat surface. Preferably, one may wish to form the liquid film only on the surfaces of the lands which exist in a single plane between the depressions 152. The presence of the liquid in the depressions may interfere with the functioning of the device.

In one exemplary embodiment, the liquid film may be a UV adhesive, which cures or hardens upon exposure to UV light, thus bonding the well wafer to an underlying device wafer, as described further below. The devices of the device wafer may require radiation passing through the well wafer for the device to function, and thus it is desirable to avoid having the liquid adhesive within the wells 152, as the layer would affect the transmission of light through the well wafer 150 to the device wafer, or otherwise corrupt the device wafer.

The well wafer 150 may have a notch 155 formed therein, which mates with the notch 145 in the wafer seat 140. This allows the orientation of the wafer with respect to the support 100 to be determined, and provides a secure fitting for the wafer 150 on the wafer seat 140 and support 100. The other end of the wafer 150 opposite the notch 155 may be held aloft by the elevator pin 112. The situation is as shown in cross section in FIG. 8b. This cross section is taken across symmetry axis b (see FIG. 6a) and the vertical cross section in FIG. 8c.

The elevator pin is used to load the wafer without touching the adhesive on any other surface. Having secured the notch feature in the wafer seat to the notch feature in the wafer, the wafer can be allowed to rest on the raised wafer elevator pin without sliding laterally. Any lateral motion of the wafer should be avoided, so as to prevent adhesive from flooding the interior of the thru-wafer holes, wells or depressions. Thus, the liquid film 130 only coats the surfaces in the same plane of well wafer 150, and the liquid does not collect in the depressions or wells 155.

Accordingly, the wafer notch 155 fits in the notch feature 145 of the wafer seat 140, while the opposite extremity rests on the elevator pin 112. At this point, using the elevator pin 112, the well wafer 150 may be gently lowered onto the liquid film 130, coating all surfaces of the well wafer 150 which are in contact with the liquid film.

The well wafer 150 is shown resting on the liquid film in FIG. 9a, and in cross section in FIG. 9b. Pressure may be applied to the backside of the well wafer 150 to reduce the entrainment of air in the liquid film 130 on the surface of well wafer 150. A swab may be used to apply this pressure.

Having coated the surface of well wafer 150 with the liquid 130, the well wafer can be removed from the support 100 and liquid 130. To remove well wafer 150, the elevator pin 112 may once again be raised within through hole 110, to lift the edge of well wafer 150 from the liquid. The other side of well wafer 150 continues to rest against the wafer seat 140. FIG. 10a shows the removal of well wafer 150 from the apparatus. The situation is similar to that depicted in FIG. 9 a-c, except that now the liquid film 135 coats the underside of well wafer 150 with a thin film of approximately one-half the thickness (t/2) of the original film 130. The residual liquid film is shown in FIGS. 10b and 10c.

Having coated the well wafer 150 with the desired liquid film 135, any residual air bubbles entrained in the film may need to be removed. Remaining air bubbles may otherwise compromise the integrity of the bond provided by the adhesive. To accomplish this, the well wafer 150 may be place in a vacuum chamber or bell jar. This is shown in FIGS. 11a and 11b.

The well wafer 150 may be placed adhesive side-down at least three supports or pedestals inside a vacuum chamber 200 as shown in FIG. 11a.

Figure 12B:
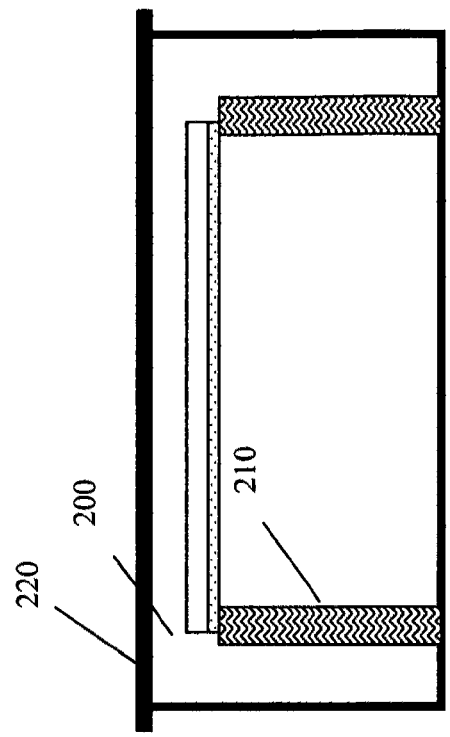
FIG. 12a shows a top view and FIG. 12b shows a cross sectional view of a twelfth step in the process.
Figure 12A:
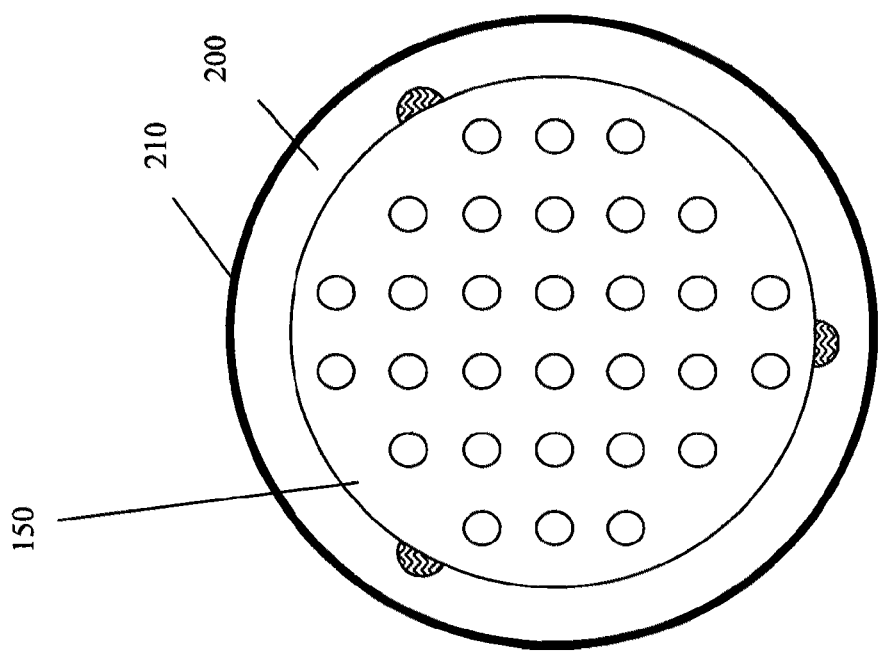

FIG. 11a shows a plan view, and FIG. 11b in cross section, of well wafer 150 resting on three or more supports 210 in vacuum chamber 200. Alternatively, other vacuum chambers may grasp the wafer by the edges. The vacuum chamber 200 may then be sealed. Upon sealing the vacuum chamber as shown in FIGS. 12a and b, the chamber is evacuated to a sub-atmospheric pressure, for example, 1 lb/in$^2$. At this reduced pressure, any remaining bubbles in the liquid film 130 may be removed. The reduced pressure may be maintained for about 10 minutes to assure the air bubbles are eliminated.

Removal of bubbles may be particularly important for applications wherein liquid layer 130 is an adhesive which, when cured, may need to provide an air-tight seal around a device cavity. If bubbles remain in the liquid film, the bond produced by the adhesive may not be hermetic. For other applications wherein bubbles in the film 130 pose no problems, this step may be skipped.

Attention now turns to preparation of the device wafer 400 to which the well wafer 150 will be adhered. As the well wafer 150 remains inside the vacuum chamber 200, an alignment fixture and device wafer may be prepared to receive the well wafer 150.

Figure 13B:
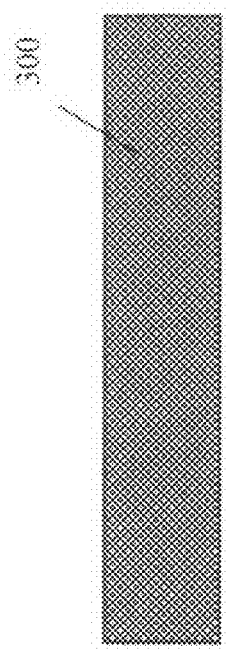
FIG. 13a shows a top view and FIG. 13b shows a cross sectional view of a thirteenth step in the process.
Figure 13A:
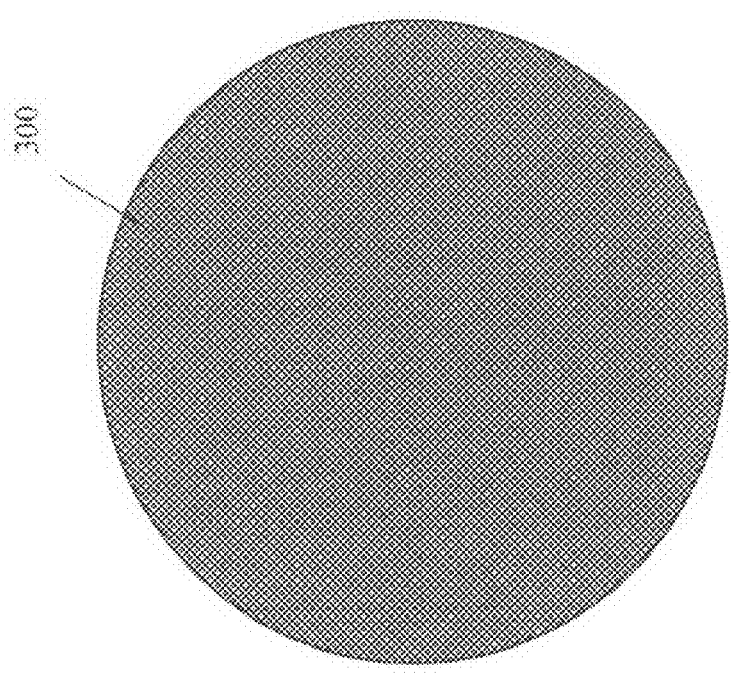

The preparation of the device wafer 400 may take place on another wafer chuck 300 (FIGS. 13a and 13b). Although not shown for ease of illustration, it should be understood that wafer chuck 300 may include vacuum passages to which a vacuum pump may be connected, such as to hold a wafer placed over these passages against the surface of wafer chuck 300.

Figure 14B:
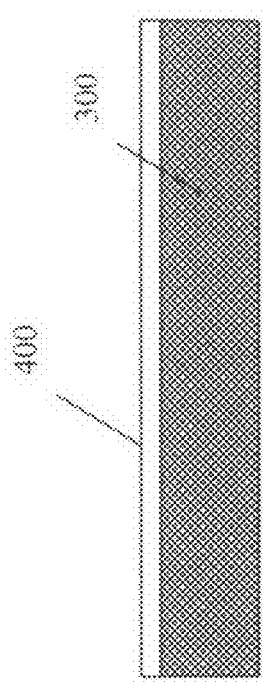
FIG. 14a shows a top view and FIG. 14b shows a cross sectional view of a fourteenth step in the process.
Figure 14A:
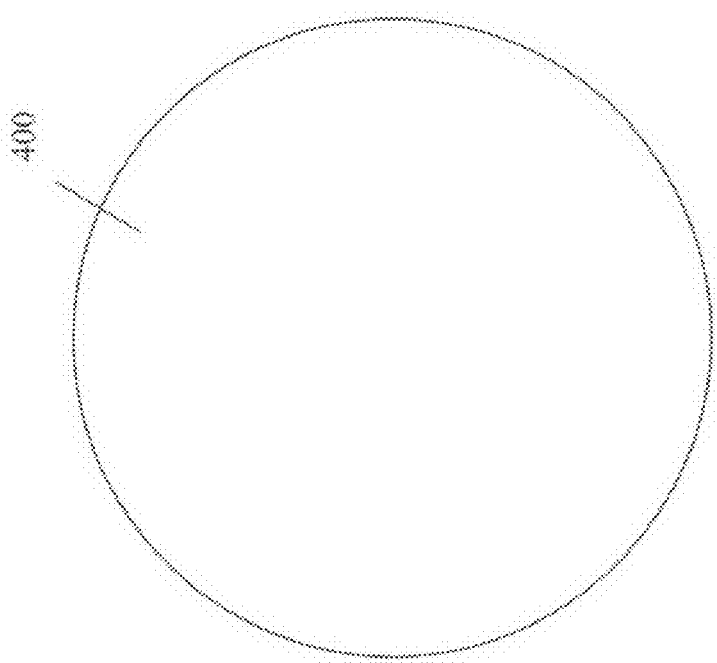

Accordingly, the device wafer 400 may be placed on wafer chuck 300, as shown in FIG. 14a, and held against the surface by vacuum pressure. Although not shown in FIG. 14a, the device wafer 400 may include a plurality of microfabricated devices (microdevices) such as integrated circuits or microelectromechanical systems (MEMS). The devices may be fabricated so as to be in registration with the depressions or features 155 in well wafer 150, when well wafer 150 is placed over top of device wafer 400.

A plurality of shims or spacers 410 may then be placed on top of device wafer 400. The shims will provide a separation between the surfaces of the device wafer 400 and the well wafer 150 while the two wafers are aligned and before bonding the wafer surfaces. The shims may be plastic or stainless steel, or any other relatively clean, inert material with a well-defined thickness. The shims 410 may be placed at intervals around the perimeter of the wafer, generally three shims placed at even ⅓ circumference intervals may provide the required support.

The device wafer 400 on wafer chuck 300 with shims 410 are shown in plan view in FIG. 15a, and in cross section in FIG. 15b.

Figure 16B:
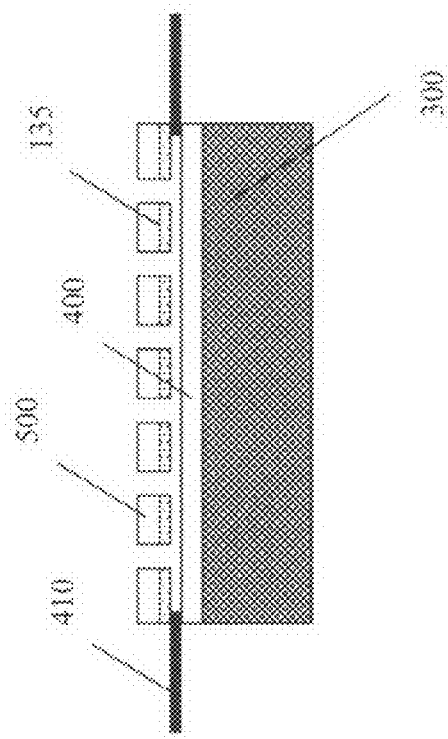
FIG. 16a shows a top view and FIG. 16b shows a cross sectional view of a sixteenth step in the process.
Figure 16A:
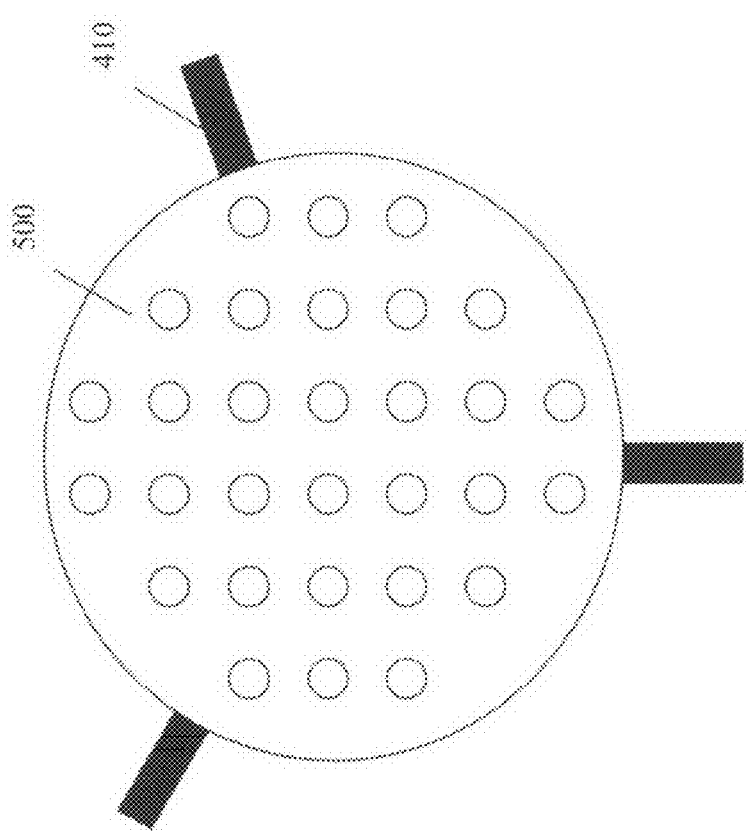
Figure 19B:
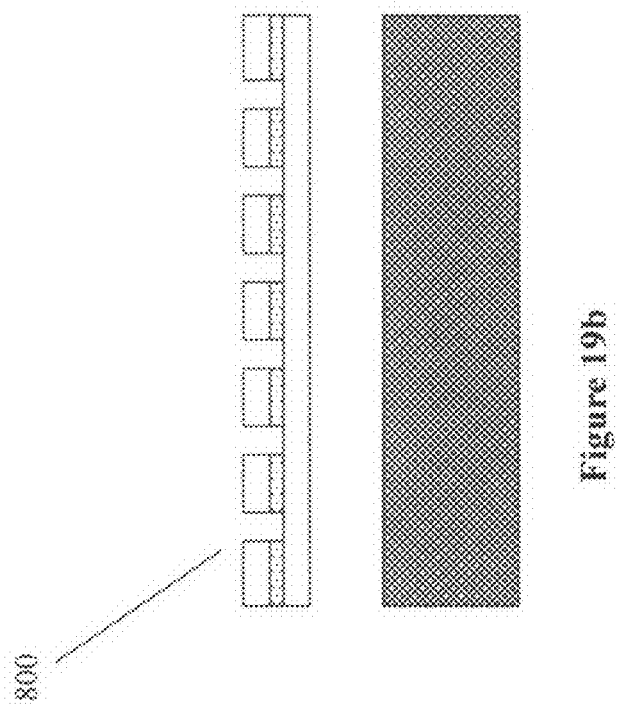
FIG. 19a shows a top view and FIG. 19b shows a cross sectional view of a nineteenth step in the process.
Figure 19A:
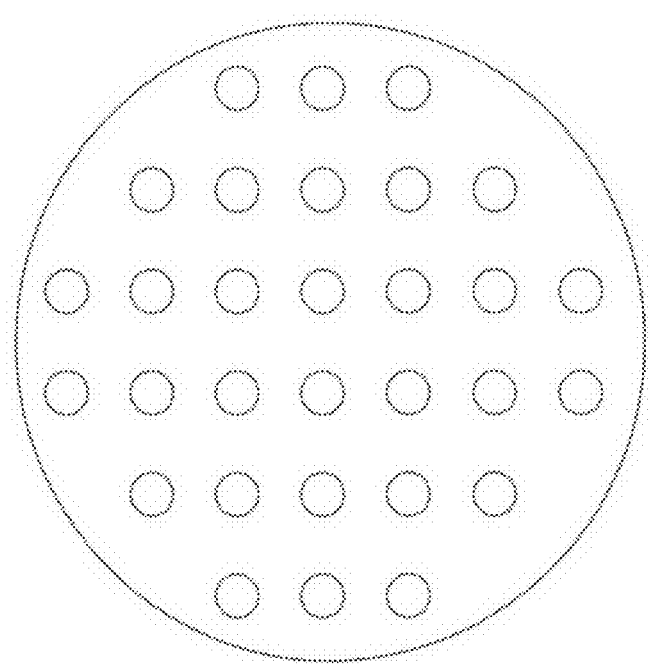

The vacuum chamber 200 containing the well wafer 150 may vented and opened, and the well wafer 150 removed. The well wafer 150 may then be placed over the device wafer 400, and supported on the shims 410, as shown in FIGS. 16a and 16b. The shims 410 may be used to hold the wafer surfaces apart so that the well wafer 150 can be properly registered against the device wafer 400. Because the shims 410 are placed at the periphery of wafers 150 and 400, they do not interfere with or touch the microfabricated devices or wells 155 on the wafers, and thus no damage to those features takes place. As is well known, such small structures may be delicate and require careful handling.

An alignment tool 600 may then be placed onto well wafer 150. The alignment tool may grasp well wafer 150 in any of a number of ways, around the periphery, or by suction to the top of well wafer 150. In the embodiment described here, alignment tool 600 grasps well wafer 150 by placing protrusions 610 into well wafer features 155. Preferably, these features are located at or near the periphery edge of well wafer 150.

The position of well wafer 150 may then be adjusted with respect to the position of device wafer 400 by this alignment tool, in either orthogonal axis as shown in FIG. 17a. The cross section of the apparatus is shown in FIG. 17b. Alternatively, the alignment tool may be movable in all three directions, x, y and z, in which case the shims 410 are not needed as the alignment tool simply lowers the well wafer 150 onto the device wafer 400. The alignment tool may adjust the position of the well wafer 150 with respect to the device wafer 400, until the alignment marks on the surface of each wafer are in their proper position. The well wafer 150 may then be lowered into contact with the device wafer 400.

To lower the well wafer 150, the three shims 410 may be replaced one at a time with thinner ones so that well wafer 150 gradually becomes closer to the device wafer 400. The first set of shims may be 100 um for example, followed by another set at 50 um, and another at 20 um. When the last shim 410 is removed, the wafers are in contact. Another swab may be used to apply downward pressure on the well wafer 150, to assure that the mating surfaces are in intimate contact, as shown in FIG. 18b. The device wafer 400 together with the well wafer 150 constitute a wafer assembly 500.

This wafer assembly may then be joined by the bonding agent, liquid adhesive layer 135. In the embodiment shown in FIG. 18b, the wafer assembly 500 is exposed to UV light from UV light source 700. Alternatively, heat can be used to activate the bonding agent, in which case source 700 may be a heat source. Because the well wafer is transparent, the light passes through well wafer 150 and reaches the UV adhesive in the thin film 135 between well wafer 150 and device wafer 400. This causes the adhesive film 135 to harden, joining the surfaces of the well wafer 150 and the device wafer 400.

The wafer assembly 500 may now be removed from the wafer chuck and/or from the vacuum chamber, as the well wafer is now sealed to the device wafer. The wafer assembly 500 may now undergo post-processing, such as dicing to separate the individual die, or wafer probe/testing, or further structure fabrication, depending on the application. The final product is shown before dicing in FIG. 19a and in cross section in FIG. 19b.

Figure 20:
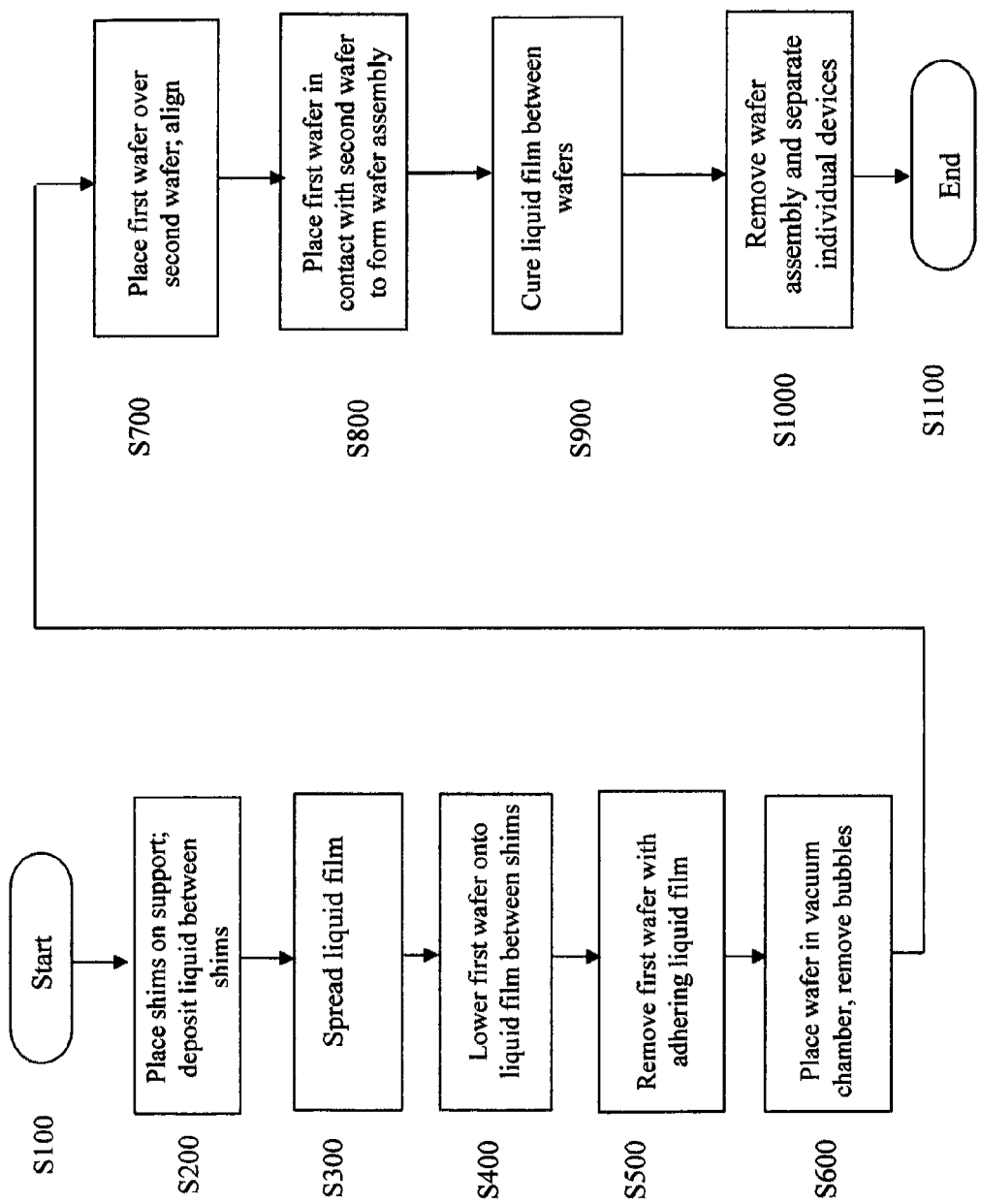
FIG. 20 is a flow charting showing one exemplary method for practicing the invention.

FIG. 20 is a flowchart illustrating an exemplary embodiment of a method for applying the thin liquid film to the surface of a wafer with topography. It should be understood that this method is exemplary only, and that various steps may be added or omitted from this exemplary embodiment.

The method begins in step S100 and proceeds to step S200, wherein support spacers are placed on a wafer chuck and the liquid is deposited between the spacers. In step S300, the liquid is spread into a thin film between the spacers. In one embodiment, the liquid is spread by translating a bar across the spacer, over the liquid, spreading the liquid into a thin film. In step S400, a first wafer is placed over the liquid film between the spacers. In one exemplary embodiment, the first wafer may be a well wafer as described above. In step S500, the first wafer is removed from the support, along with a quantity of the liquid covering its surface. In step S600, the wafer may be placed in a vacuum chamber which is then evacuated, to remove any remaining bubbles. In step S700, the first wafer with its adhering liquid is placed over a second wafer and aligned to its proper position with respect to the second wafer. In one exemplary embodiment, the second wafer is a device wafer with a plurality of devices formed thereon. In step S800, the first wafer is lowered into contact with the second wafer. In step S900, the liquid film is cured or hardened. In one exemplary embodiment, the liquid is a UV adhesive, which is cured by exposing the liquid to a source of UV radiation, to form a wafer assembly. In step S1000, the wafer assembly is removed, and the individual devices may be separated from the wafer assembly. The process ends in step S1100.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes the formation of a thin film of UV adhesive, it should be understood that the systems and methods described herein may be applied to any number of other thin liquid films and wafer with topography. Other examples include lubricant layers and photoresist applied to the surface of a lid wafer to be joined to a device wafer. Furthermore, while a type of topography, depressions or wells, is described in the exemplary embodiment, it should be understood that other numbers of other features may be present, depending on the application. Although a method is disclosed for manufacturing the well wafer transparent wafer assembly, it should be understood that this method is exemplary only, and that the steps need not be performed in the order shown, and may be adapted to produce any embodiment described herein or other embodiments encompassed. Accordingly, the exemplary implementations set forth above, are intended to be illustrative, not limiting.

What is claimed is:

1. A method for forming a thin layer of liquid on the surface of a first wafer, wherein the first wafer surface has topography formed therein, comprising:
    disposing a plurality of spacers on a wafer support surface;
    depositing a quantity of the liquid between the spacers;
    thinning the quantity of liquid by translating a bar over the spacers to form a liquid film on the support surface;
    lowering the first wafer onto the liquid film; and
    removing the first wafer from the wafer support.

2. The method of claim 1, further comprising:
    disposing the first wafer on a plurality of supports placed on a surface of a second wafer;
    aligning the first wafer to the second wafer;
    contacting a surface of the first wafer to the surface of the second wafer by removing the supports, with the thin layer of liquid disposed therebetween; and
    curing the liquid film.

3. The method of claim 1, wherein the liquid is at least one of a UV-curable adhesive, a lubricant and a photoresist.

4. The method of claim 2, wherein curing the liquid film further comprises:
    at least one of exposing the liquid film to a source of ultra-violet radiation, exposing the liquid film to a source of heat, and exposing the liquid film to a source of visible radiation.

5. The method of claim 1, further comprising:
    evacuating a chamber containing the first wafer and the liquid film; and releasing air bubbles from the liquid film into the chamber.

6. The method of claim 2, wherein the plurality of supports is a plurality of
    shims resting on the surface of the second wafer.

7. The method of claim 6, further comprising:
    removing the shims so that the first wafer is resting on the second wafer.

8. The method of claim 1, further comprising:
    forming at least one trough in the support surface, between the spacers, and extending across a substantial portion of the support surface and substantially parallel to the spacers.

9. The method of claim 1, further comprising:
    raising one edge of the first wafer from the wafer support, by raising an elevator pin housed in a through hole in the support, wherein an opposing edge of the first wafer is held against a wafer seat.

10. The method of claim 9, wherein the wafer seat includes a feature that mates with a corresponding feature on the first wafer, in order to orient the first wafer in a pre-determined orientation with respect to the second wafer.

* * * * *